(12) United States Patent
Chen et al.

(10) Patent No.: US 9,711,358 B2
(45) Date of Patent: Jul. 18, 2017

(54) METHOD OF FORMING NON-CONTINUOUS LINE PATTERN AND NON-CONTINUOUS LINE PATTERN STRUCTURE

(71) Applicant: UNITED MICROELECTRONICS CORP., Hsin-Chu (TW)

(72) Inventors: Yu-Te Chen, Tainan (TW); En-Chiuan Liou, Tainan (TW); Chia-Hsun Tseng, Tainan (TW); Shin-Feng Su, Tainan (TW); Yu-Ting Hung, Hsinchu (TW); Meng-Lin Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/399,715

(22) Filed: Jan. 5, 2017

(65) Prior Publication Data
US 2017/0117149 A1    Apr. 27, 2017

Related U.S. Application Data

(62) Division of application No. 14/753,019, filed on Jun. 29, 2015, now Pat. No. 9,583,343.

(30) Foreign Application Priority Data
May 20, 2015 (CN) .......................... 2015 1 0258199

(51) Int. Cl.
*H01L 21/027* (2006.01)
*H01L 21/033* (2006.01)
(Continued)

(52) U.S. Cl.
CPC ...... *H01L 21/0337* (2013.01); *H01L 21/0275* (2013.01); *H01L 21/0332* (2013.01);
(Continued)

(58) Field of Classification Search
CPC ............. H01L 21/0271; H01L 21/0337; H01L 21/7816
See application file for complete search history.

(56) References Cited

U.S. PATENT DOCUMENTS 4,728,591 A   3/1988 Clark
6,248,508 B1  6/2001 Murooka
(Continued)

*Primary Examiner* — Mark Prenty
(74) *Attorney, Agent, or Firm* — Winston Hsu

(57) ABSTRACT

A method of forming a non-continuous line pattern includes forming a DSA material layer on a substrate, performing a phase separation of the DSA material layer to form an ordered periodic pattern including a plurality of first polymer structures and the second polymer structures arranged alternately, forming a first mask to cover a first portion of the ordered periodic pattern, performing a first etching process to remove a portion of the first polymer structures exposed by the first mask, removing the first mask, forming a second mask to cover a second portion of the ordered periodic pattern, with an interval to the first portion of the ordered periodic pattern, performing a second etching process to remove a portion of the second polymer structures exposed by the second mask, and removing the second mask. The remaining first polymer structures and the remaining second polymer structures are not connected to each other.

11 Claims, 7 Drawing Sheets

(51) Int. Cl.
*H01L 21/311* (2006.01)
*H01L 21/768* (2006.01)

(52) U.S. Cl.
CPC .. *H01L 21/31127* (2013.01); *H01L 21/31144* (2013.01); *H01L 21/76816* (2013.01)

(56) References Cited

U.S. PATENT DOCUMENTS

| | | |
|---|---|---|
| 8,656,322 B1 | 2/2014 | Dechene |
| 8,715,917 B2 | 5/2014 | Holmes |
| 8,853,085 B1 | 10/2014 | Abdallah |
| 9,583,343 B2 * | 2/2017 | Chen ................ H01L 21/31144 |
| 2014/0094031 A1 | 4/2014 | Maeda |
| 2014/0203434 A1 | 7/2014 | Huang |
| 2014/0231388 A1 | 8/2014 | Yonemitsu |
| 2014/0273476 A1 | 9/2014 | Cheng |

* cited by examiner

METHOD OF FORMING NON-CONTINUOUS LINE PATTERN AND NON-CONTINUOUS LINE PATTERN STRUCTURE

CROSS REFERENCE TO RELATED APPLICATIONS

This patent application is a division of application Ser. No. 14/753,019 filed on Jun. 29, 2015, which is entirely incorporated herein by reference.

BACKGROUND OF THE INVENTION

1. Field of the Invention

The present invention relates to a method of forming non-continuous line pattern and a non-continuous line pattern structure on semiconductor integrated circuit (IC) substrate, and more particularly, to a method of forming non-continuous line pattern and a non-continuous line pattern structure on semiconductor IC substrate by using directed self-assembly (DSA) material.

2. Description of the Prior Art

In recent years, as the continuous decrease of the sizes of semiconductor devices and the increase of the stacking and integration density of semiconductor devices, the photolithography process approaches physical limitation such that the costs of design, process development, and photomask rise dramatically. Therefore, many traditional process tool and fabrication method cannot meet the fabrication requirement anymore. As a result, the manufacturer has to keep on developing more delicate and more expensive tools and equipment in order to meet the fabrication requirement. For example, the ArF laser tool with much expensive cost is used for replacing the traditional exposure equipment in order to gain better critical dimension and resolution of the photolithography process. In addition, the manufacturer also provides an immersion photolithography process in corporation with the ArF laser tool in order to further improve the resolution. Accordingly, it is still a challenge for the manufacturer to keep on researching and developing new process equipment and tools and advanced fabrication process to fulfill the continuously decreased device size of products.

SUMMARY OF THE INVENTION

It is one of the objectives of the present invention to provide a method of forming non-continuous line pattern and to provide a non-continuous line pattern structure on semiconductor substrate, wherein DSA material and related fabrication process are utilized in order to reach the target of improving the critical dimension of devices.

According to one embodiment of the present invention, a method of forming a non-continuous line pattern is provided. The method includes first providing a substrate, forming a DSA material layer on the substrate, and performing a phase separation of the DSA material layer to form an ordered periodic pattern, wherein the ordered periodic pattern includes a plurality of first polymer structures and a plurality of second polymer structures arranged alternately. Then, a first mask is formed on the DSA material layer to cover a first portion of the ordered periodic pattern, and a first etching process is carried out to remove a portion of the first polymer structures exposed by the first mask. After that, the first mask is removed. Then, a second mask is formed on the DSA material layer to cover a second portion of the ordered periodic pattern, wherein an interval exits between the adjacent boundaries of the second portion and the first portion of the ordered periodic pattern. Sequentially, a second etching process is carried out to remove a portion of the second polymer structures exposed by the second mask, and then the second mask is removed, wherein the remaining first polymer structures and the remaining second polymer structures are not connected to each other.

According to an embodiment of the present invention, a non-continuous line pattern structure on the semiconductor integrated circuit (IC) substrate is further provided, which includes a plurality of first line pattern segments and a plurality of second line pattern segments disposed on the semiconductor IC substrate. Wherein, the first line pattern segments are arranged parallel to a first direction, and any two adjacent first line pattern segments of the first line pattern segments have a first line spacing. The second line pattern segments are arranged parallel to the first direction too, and any two adjacent second line pattern segments of the second line pattern segments have a second line spacing. The first line pattern segments and the second line pattern segments are arranged alternately along a second direction, wherein the second direction is perpendicular to the first direction. The first line pattern segments and the second line pattern segments are not connected to each other and are not overlapped with each other along the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 are schematic diagrams of fabrication process of the method of forming a non-continuous line pattern according to an embodiment of the present invention, wherein:

FIG. 1 is a schematic diagram of the top view of a semiconductor IC substrate and the material layer disposed thereon;

FIG. 2 is a schematic diagram of the sectional view of the semiconductor IC substrate along the sectional line 2-2' shown in FIG. 1;

FIG. 3 is a schematic diagram of the top view of the DSA material layer in a step subsequent to FIG. 2;

FIG. 4 is a schematic diagram of the sectional view along the sectional line 4-4' shown in FIG. 3;

FIG. 5 is a schematic diagram of the top view of the DSA material layer in a step subsequent to FIG. 3;

FIG. 6 is a schematic diagram of the top view of the DSA material layer in a step subsequent to FIG. 5;

FIG. 7 is a schematic diagram of the top view of the DSA material layer in a step subsequent to FIG. 6;

FIG. 8 is a schematic diagram of the top view of the DSA material layer in a step subsequent to FIG. 7;

FIG. 9 is a schematic diagram of the top view of anon-continuous line pattern structure on a semiconductor IC substrate.

FIG. 10 is a schematic diagram of the sectional view according to the sectional line 10-10' shown in FIG. 9.

FIG. 11 is a schematic drawing in a step subsequent to FIG. 10.

FIG. 12 is a schematic drawing in a step subsequent to FIG. 11.

FIG. 13 is a schematic diagram of the top view of a non-continuous line pattern structure on a semiconductor IC substrate in a step subsequent to FIG. 12.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
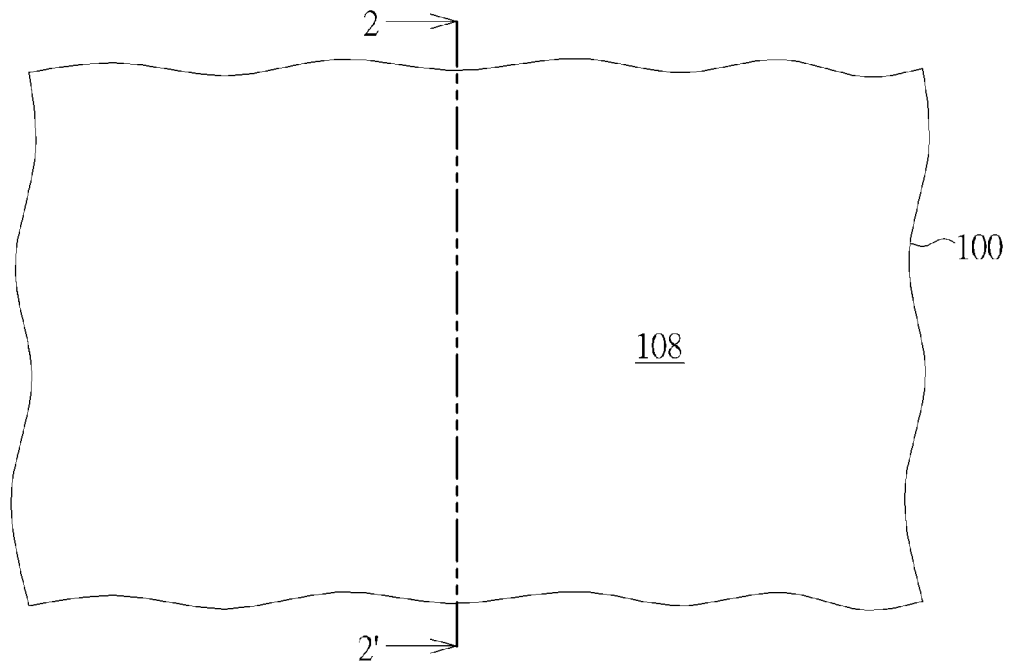
Figure 2:
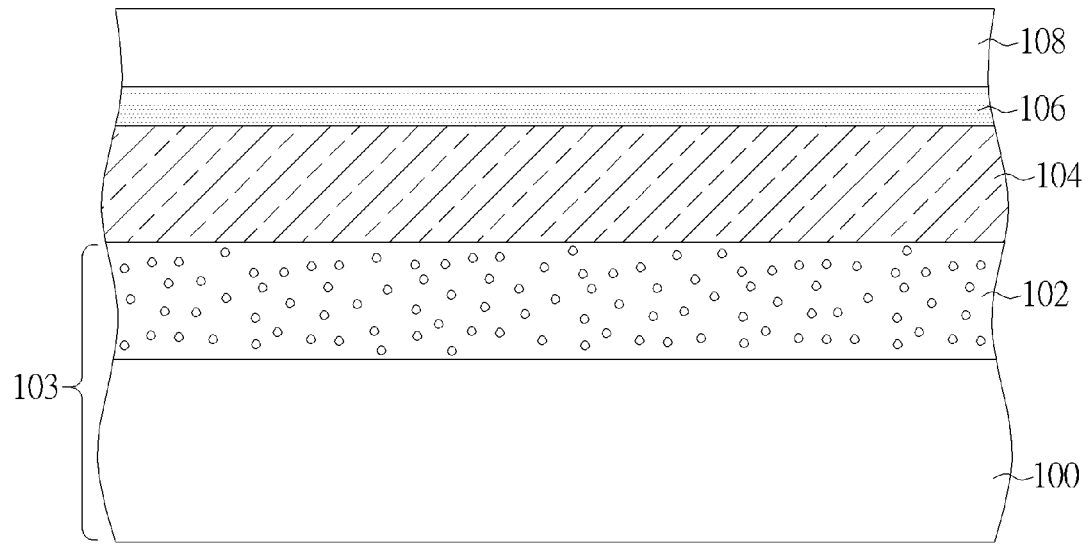
Figure 9:
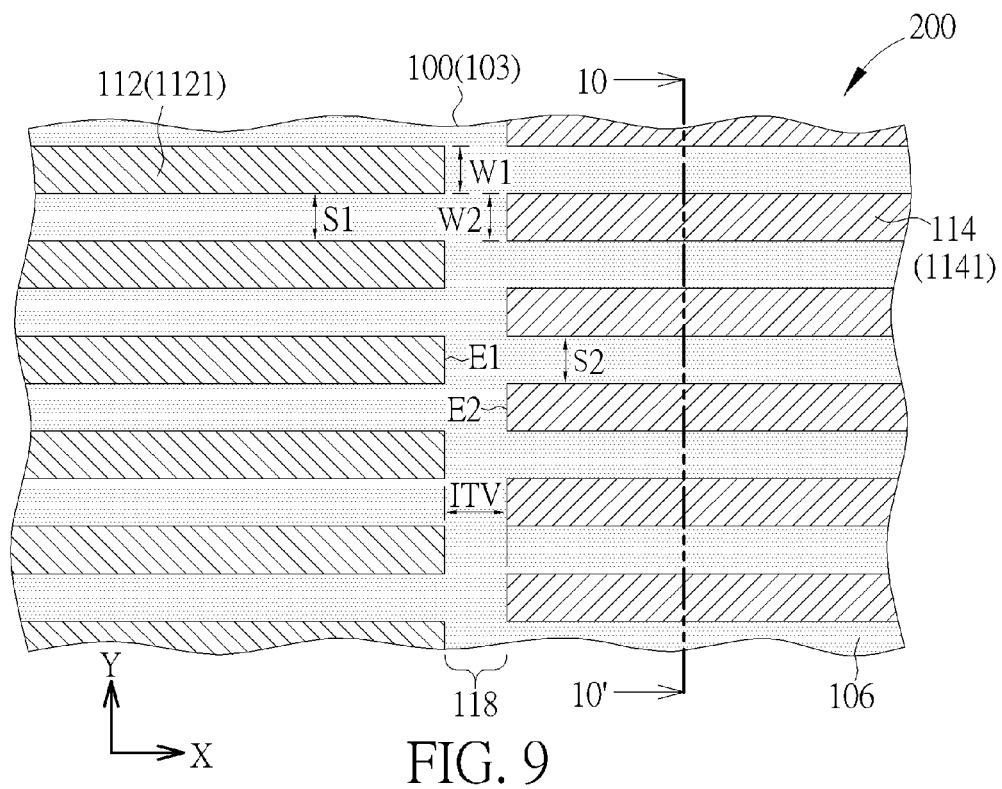

Please refer to FIG. 1 to FIG. 13. FIG. 1 to FIG. 13 are schematic diagrams of fabrication process of the method of forming a non-continuous line pattern according to an embodiment of the present invention, wherein FIG. 9 illustrates a non-continuous line pattern structure on a semiconductor IC substrate. As shown in FIG. 1 and FIG. 2, FIG. 1 illustrates a schematic diagram of the top view of a semiconductor IC substrate and the material layer disposed thereon, and FIG. 2 is a schematic diagram of the sectional view of the semiconductor IC substrate along the sectional line 2-2' shown in FIG. 1. According to this embodiment, one of the objectives of the present invention is to form a non-continuous line pattern structure on the surface of the semiconductor IC substrate, and the fabrication method of the present invention includes first providing a substrate 103, which may be a semiconductor wafer with/without other films or layers thereon. For example, the substrate 103 maybe a semiconductor IC substrate. In this embodiment, the substrate 103 includes a semiconductor IC substrate 100 and a target layer 102 disposed on the surface of the semiconductor IC substrate 100, wherein the target layer 102 can be any film or layer predetermined to be patterned in order to form a non-continuous line pattern structure. For instance, the target layer 102 may be a dielectric material layer or a metal layer. This embodiment takes the target layer 102 including conductive material as an example, but not limited thereto. In addition, in an variant embodiment of this embodiment, there may be other film(s) or layer(s) disposed between the semiconductor IC substrate 100 and the target layer 102, and it is not limited to that only one target layer 102 is disposed on the surface of the semiconductor IC substrate 100 in this embodiment. According to this embodiment, a hard mask layer 104 and a neutral bottom layer 106 may be selectively formed on the surface of the substrate 103 in order. The material of the hard mask layer 104 is silicon nitride for instance, and the neutral bottom layer 106 may include neutral polymer material, such as Poly-Styrene (PS), Poly Methyl Metha Crylate (PMMA) or silicon oxide (SiO2). For example, the thickness of the neutral bottom layer 106 is about 40 nm to 100 nm, but not limited thereto. In this embodiment, the hard mask layer 104 and the neutral bottom layer 106 are both blanketly formed on the surface of the substrate 103. After forming these two layers, a directed self-assembly (DSA) material layer 108 is formed on the substrate 103 to cover the hard mask layer 104 and the neutral bottom layer 106. Wherein, the material of the DSA material layer 108 includes block co-polymer (BCP) material, such as polystyrene-b-polymethylmethacrylate (PS-b-PMMA). However, the DSA material layer 108 is not limited to the above-mentioned material and may include other known block co-polymer materials for instance. The DSA material layer 108 may be formed on the neutral bottom layer 106 through spin coating process, but not limited thereto.

Figure 3:
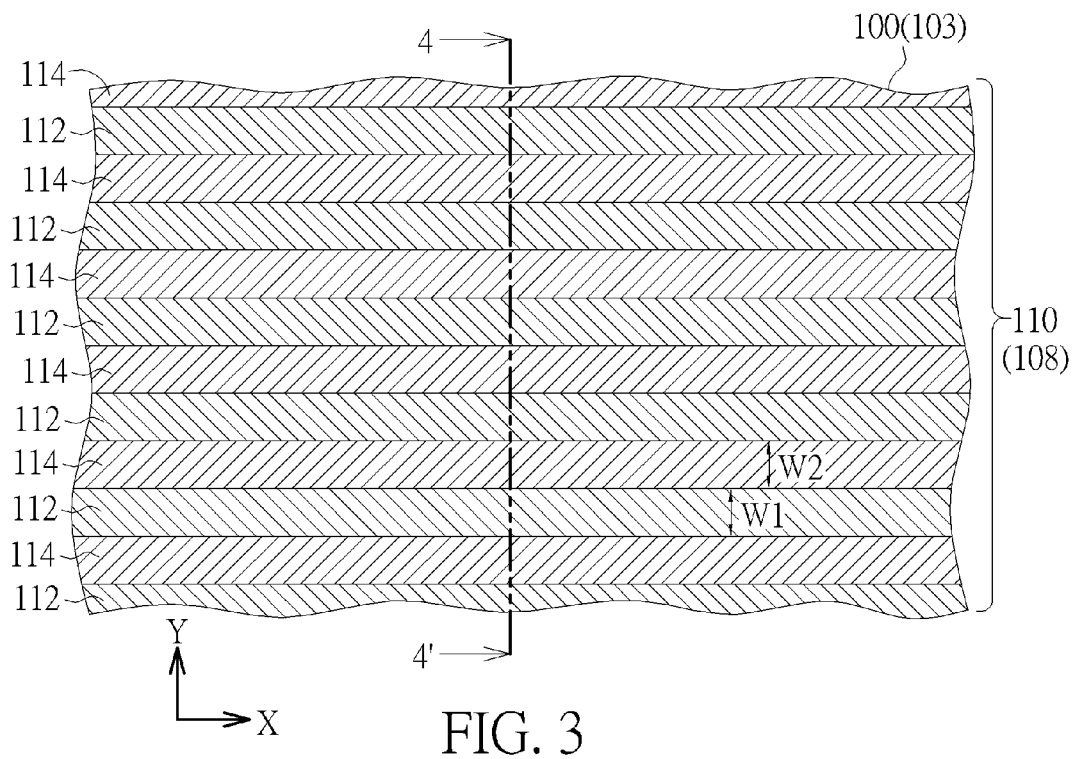
Figure 4:
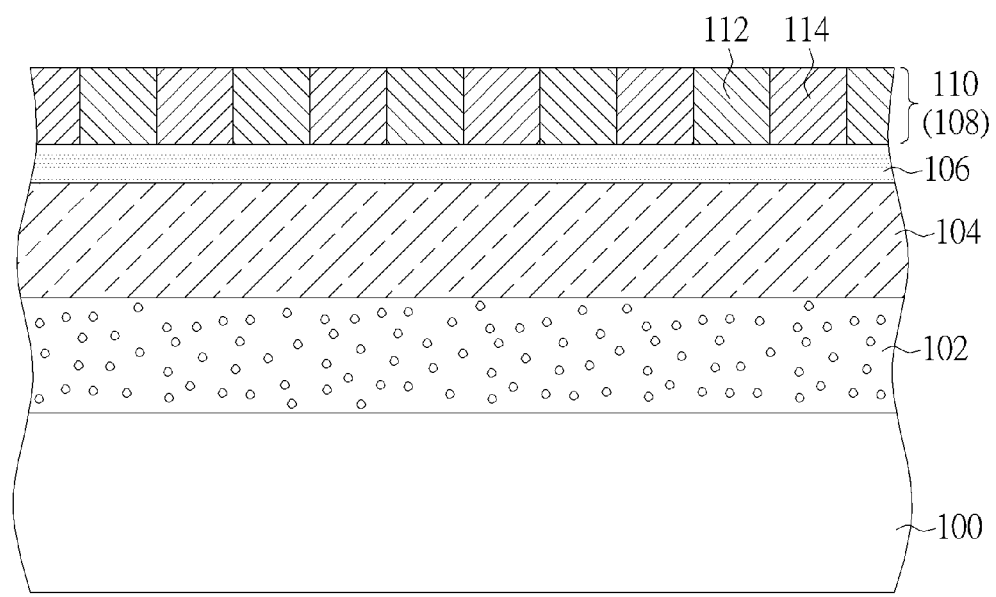

Please refer to FIG. 3 and FIG. 4. FIG. 4 is a schematic diagram of the sectional view along the sectional line 4-4' shown in FIG. 3. Then, a phase separation process of the DSA material layer 108 is performed to form an ordered periodic pattern 110. Wherein, the phase separation process of the DSA material layer 108 maybe carried out through an annealing process. For example, the annealing process is performed at a temperature of 200° C. for 5 minutes, but not limited thereto. The formed ordered periodic pattern 110 includes a plurality of first polymer structures 112 and a plurality of second polymer structures 114 arranged alternately. The first polymer structures 112 and the second polymer structures 114 both have patterns of strip shapes, extending in parallel to the first direction X and arranged alternately along the second direction Y, wherein the first direction X crosses the second direction Y. In this embodiment, the first direction X is perpendicular to the second direction Y. The function of the above-mentioned neutral bottom layer 106 is used for controlling the arrangement and pattern of the first polymer structures 112 and the second polymer structures 114 of the ordered periodic pattern 110 during the phase separation process, but not limited thereto. The first polymer structures 112 and the second polymer structures 114 respectively include different polymer materials with different properties. For example, the first polymer structures 112 are hydrophilic while the second polymer structures 114 are hydrophobic, but not limited thereto. It should be noted that the materials of the first polymer structures 112 and the second polymer structures 114 may have interchanged properties in another embodiment. In addition, the first polymer structures 112 and the second polymer structures 114 have a line width W1 and a line width W2 along the second direction Y respectively. The line width W1 is equal to the line width W2 in this embodiment, which means the first polymer structures 112 and the second polymer structures 114 have the same dimension, but not limited thereto. The dimension range of the line width W1 and the line width W2 are about 9 nm to about 30 nm for instance. As an example, both the line width W1 and the line width W2 are, but not limited to, 20 nm in this embodiment.

Figure 5:
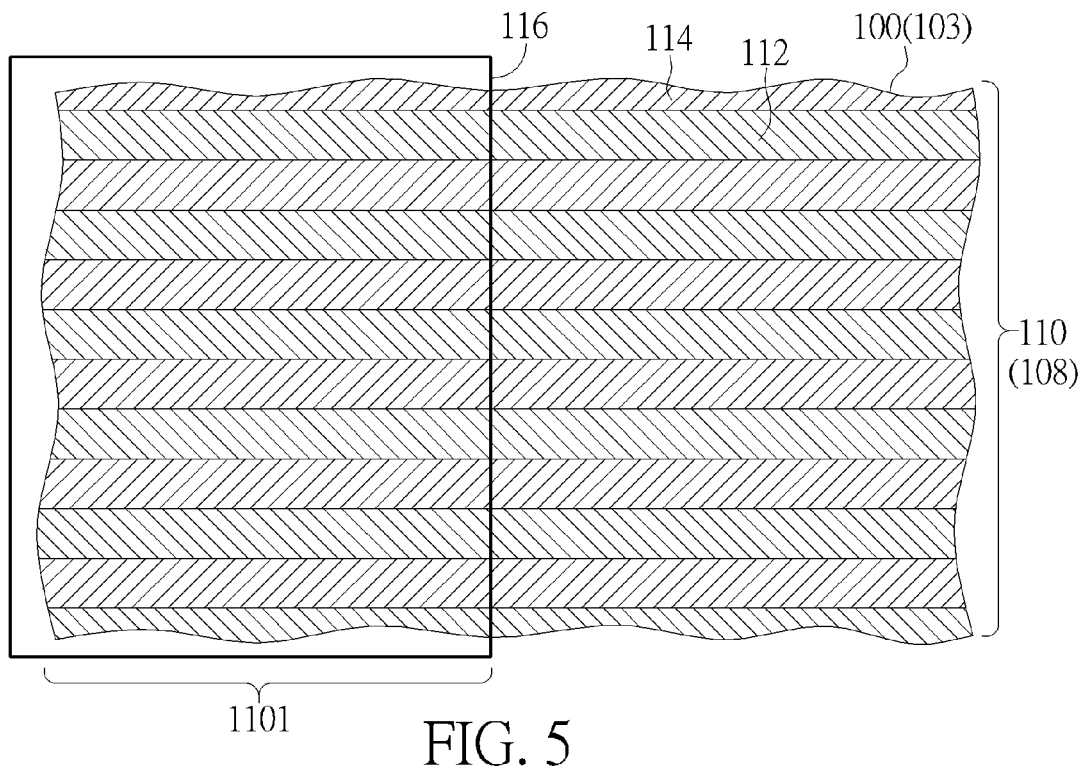
Figure 6:
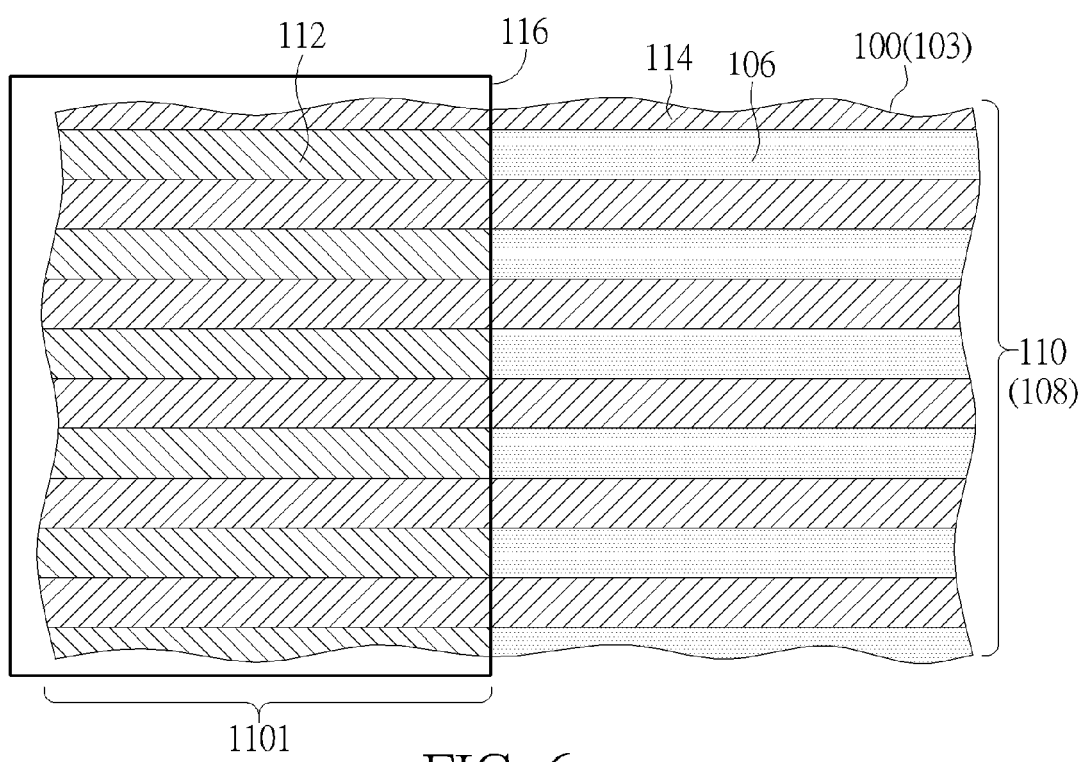

Then, please refer to FIG. 5. A first mask 116 is formed on the surface of the substrate 103 to cover a first portion 1101 of the ordered periodic pattern 110. In order to clearly illustrate the whole pattern of the first mask 116, the first mask 116 is not cut off by an abbreviation mark in FIG. 5. As shown in the figure, the first mask 116 has a block-shaped pattern. As an example, the first mask 116 may cover ten or more numbers of the first polymer structures 112 and the second polymer structures 114 along the second direction Y. Therefore, the first mask 116 of this embodiment has a width along the second direction Y greater than about 280 nm, but not limited thereto. The first mask 116 may be composed of photoresist material, and may be formed by blanketly forming a first photoresist layer on the surface of the substrate 103, and removing a portion of the first photoresist layer by performing a exposure and development process, wherein the remaining portion of the first photoresist layer forms the first mask 116 and which has the pattern of the first portion 1101 shown in FIG. 5. Since the first mask 116 has a block-shaped pattern which is not a precise pattern at all, the above-mentioned exposure and development process can be performed by using a krypton fluoride (KrF) laser tool to expose the first photoresist layer for defining the pattern of the first mask 116. After that, referring to FIG. 6, the first mask 116 is taken as an etching mask to perform a first etching process, in which an etchant with high selectivity ratio of the first polymer structures 112 to the second polymer structures 114 is used to remove a portion of the first polymer structures 112 exposed by the first mask 116. It should be noted that the second polymer structures 114 with strip shapes exposed by the first mask 116 are still remained on the surface of the substrate 103.

Figure 7:
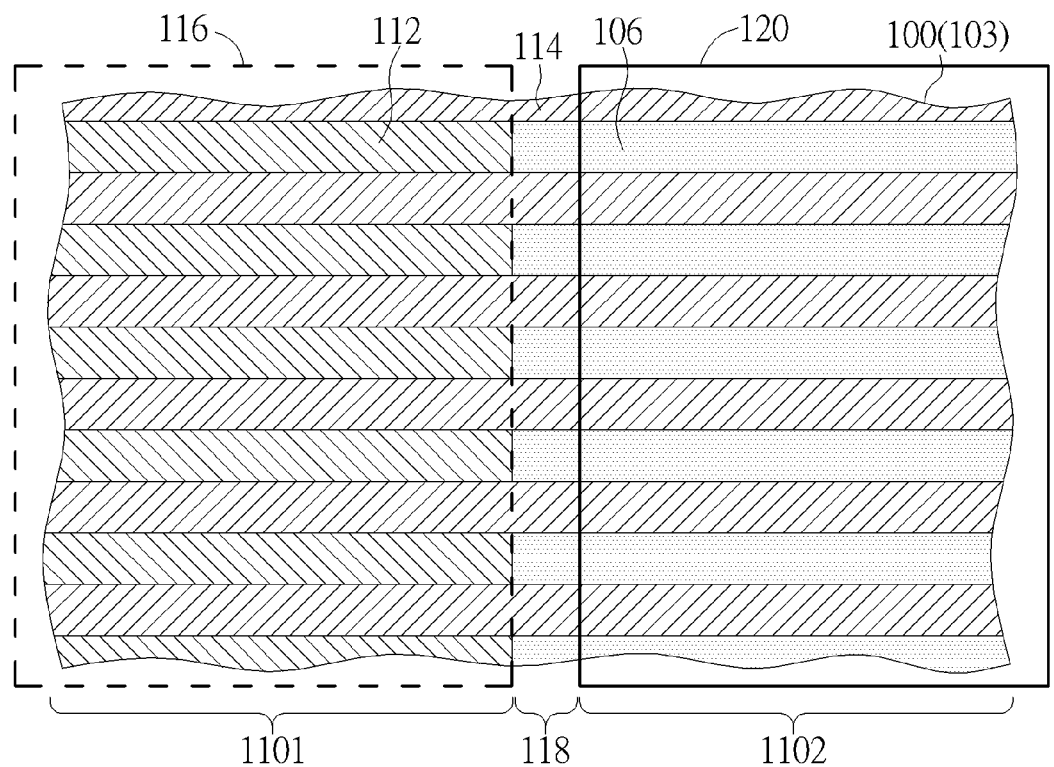
Figure 8:
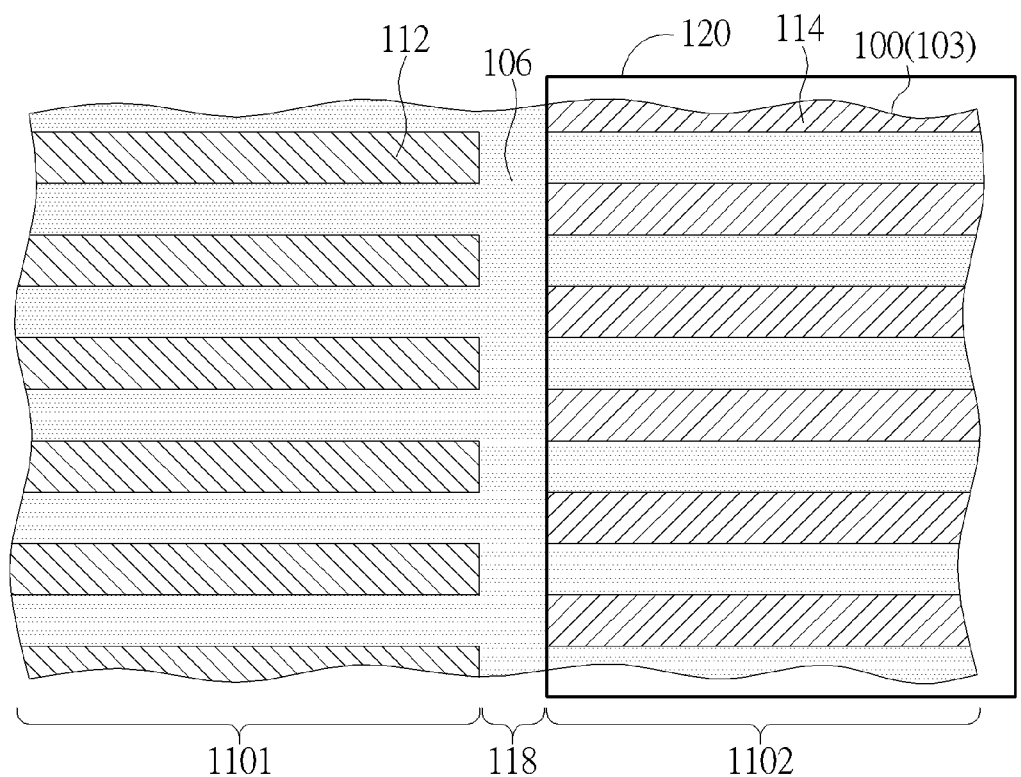

As shown in FIG. 7, the first mask 116 is then removed, and a second mask 120 is formed on the surface of the substrate 103 to cover a second portion 1102 of the ordered periodic pattern 110. The second portion 1102 and the first portion 1101 of the ordered periodic pattern 110 do not overlap each other, and there is an interval 118 exists between the adjacent boundaries of the first portion 1101 and the second portion 1102. In FIG. 7, the location of the first mask 116 is marked with dotted line in order to present the first portion 1101 of the ordered periodic pattern 110 and the interval 118. Similar to FIG. 5, in order to clearly show the pattern of the second mask 120, the second mask 120 is not cut off by an abbreviation mark in FIG. 7 to illustrate that the second mask 120 has a block-shaped pattern with larger dimension. For example, the second mask 120 may cover ten or more numbers of the first polymer structures 112 and the second polymer structures 114 along the second direction Y. The second mask 120 may include photoresist material and its formation process is similar to the first mask 116. As an example, a second photoresist layer may be first formed on the substrate 103, and an exposure and development process is then performed to pattern the second photoresist layer so as to define the pattern of the second mask 120 on the second photoresist layer, wherein the exposure process may be carried out by a KrF laser tool, but not limited thereto. It should be noted that the width of the interval 118 in this embodiment is, but not limited to, about 10 nm to about 100 nm for example, which means the spacing between the adjacent boundaries of the first mask 116 and the second mask 120 is about 10 nm to about 100 nm when defining the patterns of this two masks, wherein it is preferred that the dimension of the spacing is designed to be within the resolution and critical dimension of the KrF laser tool. Please refer to FIG. 8, the second mask 120 is then taken as an etching mask to perform a second etching process to the second polymer structures 114 by using an etchant with high selectivity ratio of the second polymer structures 114 to first polymer structures 112, so as to remove a portion of the second polymer structures 114 not covered by the second mask 120. After the second etching process, the first polymer structures 112 exposed by the second mask 120 are stilled remained on the substrate 103.

Figure 10:
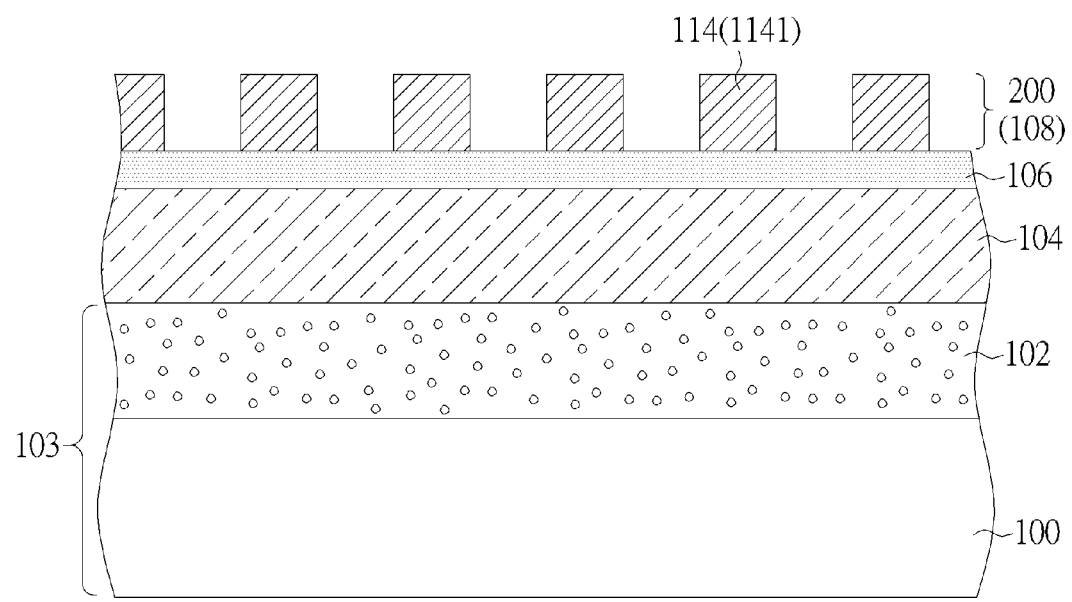

Please refer to FIG. 9 and FIG. 10, wherein FIG. 10 is a schematic diagram of the sectional view according to the sectional line 10-10' shown in FIG. 9. After performing the second etching process, the second mask 120 is removed to obtain a non-continuous line pattern structure 200 on the semiconductor IC substrate 100, wherein the remaining portions of the first polymer structures 112 and the remaining portions of the second polymer structures 114 do not connect to each other. Furthermore, the remaining first polymer structures 112 and the remaining second polymer structures 114 do not overlap each other along the first direction X and are arranged alternately along the second direction Y so as to expose their under layer, such as the neutral bottom layer 106.

As a result, the fabrication process of the present invention illustrated in FIG. 1 to FIG. 10 forms a non-continuous line pattern structure 200 on the semiconductor IC substrate 100. As shown in FIG. 9, the non-continuous line pattern structure 200 includes a plurality of first line pattern segments 1121 and a plurality of second line pattern segments 1141 disposed on the semiconductor IC substrate 100. The first line pattern segments 1121 and the second line pattern segments 1141 are both in parallel to the first direction X. In other words, the first line pattern segments 1121 and the second line pattern segments 1141 both extend along the first direction X. Furthermore, any two adjacent first line pattern segments 1121 have a first line spacing S1 therebetween, and any two adjacent second line pattern segments 1141 have a second line spacing S2 therebetween. The first line pattern segments 1121 and the second line pattern segments 1141 are arranged along the second direction Y alternately. As mentioned above, the second direction Y is perpendicular to the first direction X. In addition, the first line pattern segments 1121 and the second line pattern segments 1141 do not connect to each other and do not overlap each other along both the second direction Y and the first direction X. In addition, according to this embodiment, the first line spacing S1 is equal to the line width W2 of the second line pattern segments 1141, and the second line spacing S2 is equal to the line width W1 of the first line pattern segments 1121, but not limited thereto. Specifically, each of the first line pattern segments 1121 has a first end E1 adjacent to the second line pattern segments 1141 and each of the second line pattern segments 1141 has a second end E2 adjacent to the first line pattern segments 1121. There is an interval ITV existing between the first end E1 and the second end E2 along the first direction X and the interval ITV is equal to the interval 118 between the first portion 1101 and the second portion 1102 shown in FIG. 7, whose width is, but not limited to, about 10 nm to about 100 nm for example. As shown in FIG. 9, when defining the patterns of the first mask 116 and the second mask 120, the reserved interval 118 therebetween has a specific function to ensure that the first polymer structures 112 and the second polymer structures 114 exposed in the interval 118 can be effectively removed during performing the first etching process and the second etching process, such that it is guaranteed the finally formed first line pattern segments 1121 and second line pattern segments 1141 do not connect to each other because the first line pattern segments 1121 and the second line pattern segments 1141 are completely cut at the interval 118 for forming non-continuous line patterns.

Figure 11:
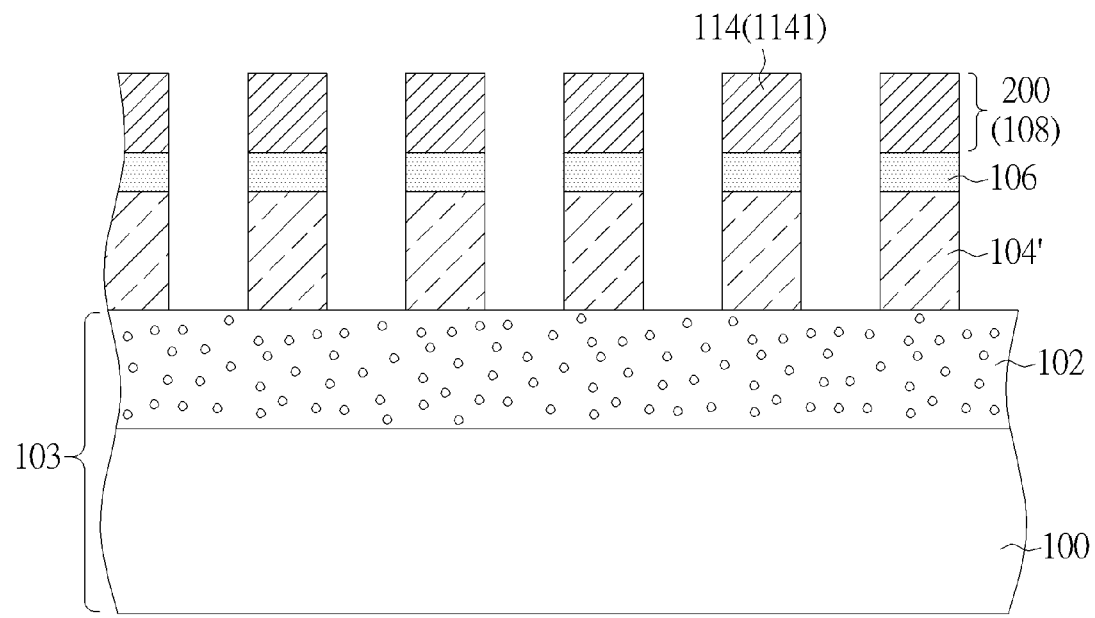
Figure 12:
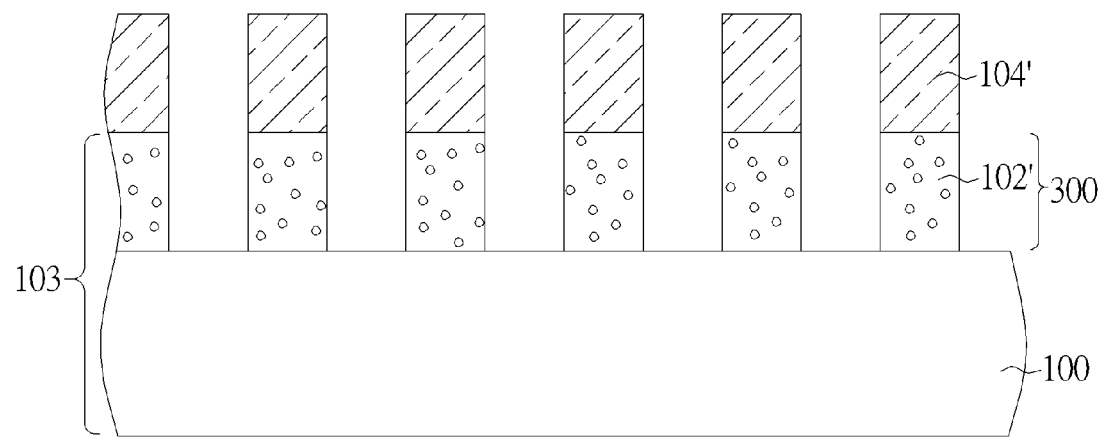
Figure 13:
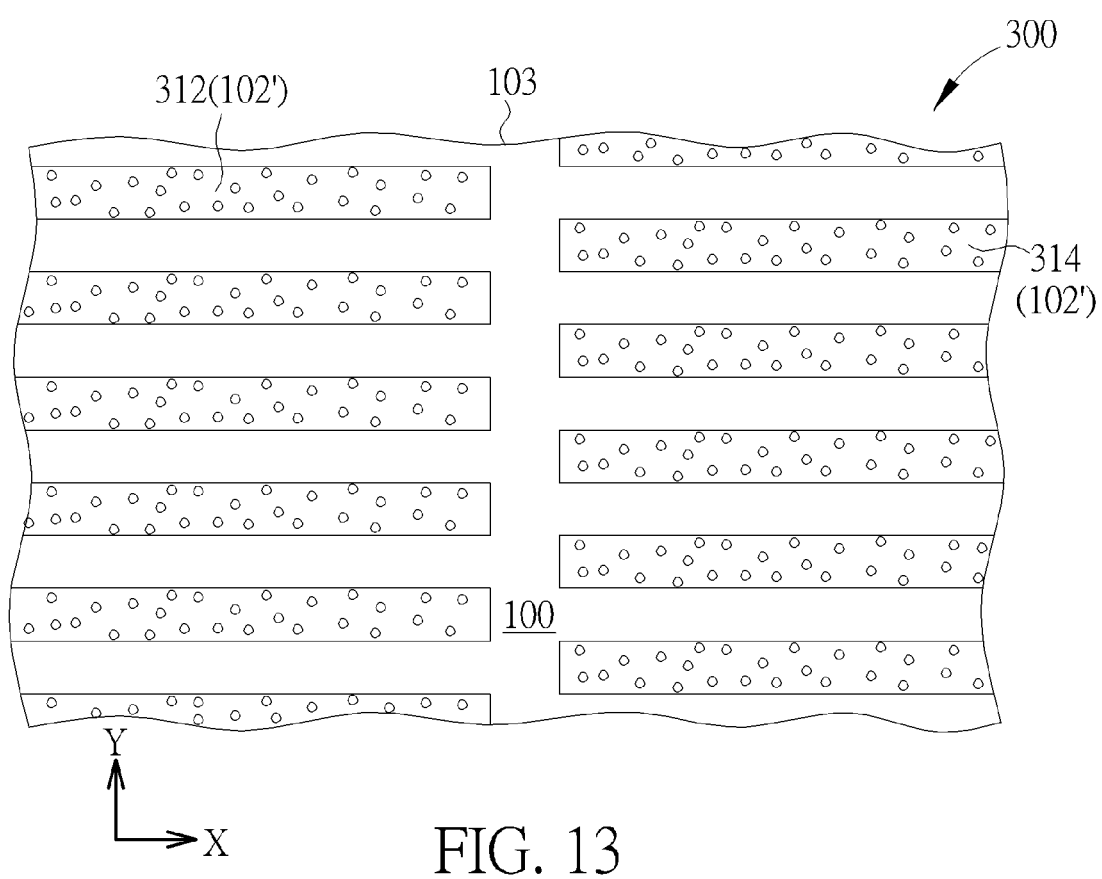

Since one of the objectives of the present invention is to form a patterned structure onto the substrate 103 having the same pattern as the non-continuous line pattern structure 200, a process could be further carried out to transfer the pattern of the non-continuous line pattern structure 200 to the substrate 103, such as the target layer 102 on the semiconductor IC substrate 100. Therefore, the non-continuous line pattern structure 200 is then taken as an etching mask to perform a third etching process to the substrate 103. In detailed description, the patterns of the remaining first polymer structures 112 and second polymer structures 114 after the second etching process can be first transferred to the neutral bottom layer 106 and the hard mask layer 104 to form a patterned hard mask 104', as shown in FIG. 11, then the remaining first polymer structures 112 and the remaining second polymer structures 114 are optionally removed, as shown in FIG. 12, and the patterned hard mask 104' is taken as an etching mask to perform the third etching process so as to remove the portion of the substrate 103 exposed by the patterned hard mask 104'. If the objective of the fabrication process is to form the non-continuous line pattern in the target layer 102, a portion of the target layer 102 not covered by the patterned hard mask 104' is removed during the third etching process, and then the patterned hard mask 104' is removed. Therefore, the patterned target layer 102' is formed which includes a pattern the same as the non-continuous line pattern structure 200. As a result, the patterned target layer 102' also includes a non-continuous line pattern structure 300, as shown in FIG. 13. The non-continuous line pattern structure 300 of the target layer 102 includes a plurality of first line pattern segments 312 and a plurality of second line pattern segments 314, both of which are in parallel to the first direction X. The first line pattern segments 312 and the second line pattern segments 314 do not overlap each other and are arranged alternately along the second direction Y without overlapping each other. Then, the non-continuous line pattern structure 300 may be utilized to form other devices on the semiconductor IC substrate 100. As an example, a dielectric layer, contact holes and contact plugs may be formed on the non-continuous line pattern structure 300 for electrically connect portions of the first line pattern segments 312 and the second line pattern segments 314, but not limited thereto.

According to the method of forming non-continuous line pattern of the present invention, the directed self-assembly property of the DSA material layer is utilized for forming the first and the second polymer structures with line patterns having small dimensions after the phase separation process, and the first and the second masks having block shapes with large dimensions are then used to perform etching processes to remove undesired portions of the DSA material layer, in corporation with the profit of the different materials and properties of the first and the second polymer structures, so as to form very fine non-continuous line pattern structure on the semiconductor IC substrate. It is noteworthy that the exposure and development process carried out in the fabrication method of the present invention only needs to define the patterns of the first and the second masks with large dimensions, such that the requirement of resolution and critical dimension of the exposure process or the photolithography process of the present invention is much flexible and much broad than the prior-art exposure or photolithography process for directly defining a pattern with 20 nm to 40 nm. As a result, the KrF laser tool, for instance, with lower resolution can be used for defining the pattern of the first and the second masks, which means only the boundaries of the first portion and the second portion shown in FIG. 7 is need to be defined to obtain the line pattern with small dimensions, in collocation with the property of the DSA material layer. Therefore, the line pattern structure with fine dimension can be fabricated according to the present invention without using advanced expensive process tool or equipment (such as ArF laser tool) and immersion photolithography process with high cost, which effectively save the fabrication cost. In other words, the present invention provides a simplified fabrication process with lower cost to gain high exposure resolution and critical dimension which can only be obtained by using expensive equipment and by performing complicated process in the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a non-continuous line pattern, comprising:
providing a substrate;
forming a directed self-assembly (DSA) material layer on the substrate;
performing a phase separation process of the DSA material layer to form an ordered periodic pattern that includes a plurality of first polymer structures and a plurality of second polymer structures arranged alternately;
forming a first mask to cover a first portion of the ordered periodic pattern;
performing a first etching process to remove a portion of the first polymer structures exposed by the first mask;
removing the first mask;
forming a second mask to cover a second portion of the ordered periodic pattern, wherein an interval exists between adjacent boundaries of the second portion and the first portion of the ordered periodic pattern;
performing a second etching process to remove a portion of the second polymer structures exposed by the second mask; and
removing the second mask, wherein the remaining first polymer structures and the remaining second polymer structures are not connected to each other.

2. The method of forming the non-continuous line pattern according to claim 1, further comprising forming a hard mask layer on the substrate before forming the DSA material layer.

3. The method of forming the non-continuous line pattern according to claim 2, further comprising:
after removing the second mask, transferring a pattern of the remaining first polymer structures and the remaining second polymer structures to the hard mask layer for forming a patterned hard mask; and
performing a third etching process to the substrate to remove a portion of the substrate exposed by the patterned hard mask.

4. The method of forming the non-continuous line pattern according to claim 3, further comprising removing the remaining first polymer structures and the remaining second polymer structures before performing the third etching process.

5. The method of forming the non-continuous line pattern according to claim 1, wherein the phase separation process of the DSA material layer is carried out through an annealing process.

6. The method of forming the non-continuous line pattern according to claim 1, further comprising forming a neutral bottom layer on the substrate before forming the DSA material layer.

7. The method of forming the non-continuous line pattern according to claim 1, wherein the DSA material layer comprises block co-polymer (BCP).

8. The method of forming the non-continuous line pattern according to claim 1, wherein the first polymer structures are hydrophilic, and the second polymer structures are hydrophobic.

9. The method of forming the non-continuous line pattern according to claim 1, wherein patterns of the first mask and the second mask are respectively defined through a photolithography process by using a krypton fluoride (KrF) laser tool.

10. The method of forming the non-continuous line pattern according to claim 1, wherein a width of the interval is about 10 nm to about 100 nm.

11. The method of forming the non-continuous line pattern according to claim 1, wherein the first portion and the second portion of the ordered periodic pattern are not overlapped with each other.

* * * * *